United States Patent [19]

Shimakata

[11] Patent Number: 5,241,567
[45] Date of Patent: Aug. 31, 1993

[54] CIRCUIT FOR DEMODULATING PSK MODULATION SIGNALS

[75] Inventor: Yukihiro Shimakata, Mitaka, Japan
[73] Assignee: Japan Radio Co., Ltd., Mitaka, Japan
[21] Appl. No.: 724,184
[22] Filed: Jul. 1, 1991
[30] Foreign Application Priority Data
  Jul. 5, 1990 [JP] Japan .................................. 2-178744
[51] Int. Cl.$^5$ .............................................. H03D 3/18
[52] U.S. Cl. ...................................... 375/82; 307/526; 329/307
[58] Field of Search .................. 375/82, 80, 94, 83, 375/118, 119, 81; 455/205; 329/304, 305, 307; 328/109, 134, 55, 155; 307/510, 514, 526, 262

[56] References Cited
U.S. PATENT DOCUMENTS

| | | | |
|---|---|---|---|
| 4,628,271 | 12/1986 | Takayama | 375/82 X |
| 4,714,892 | 12/1987 | Ishizuka | 375/82 X |
| 4,827,488 | 5/1989 | Shibano | 375/83 X |

*Primary Examiner*—Curtis Kuntz
*Assistant Examiner*—Tesfaldet Bocure
*Attorney, Agent, or Firm*—Oliff & Berridge

[57] ABSTRACT

In a differential-detection demodulator circuit, a PSK modulated signal is compared with a locally oscillated signal to obtain a phase difference between the two signals, whereupon the phase difference is demodulated. A phase detector circuit of the digital type outputs the phase difference signal. The digital phase comparator circuit compares plural reference signals, which give predetermined delays to the locally oscillated signals having carrier frequencies, with the inputted modulated signals. Preferably, a pulse signal having a phase difference between the inputted modulated signal and the locally oscillated signal is produced, and the pulse width of this pulse signal is measured by a counter. By digitalizing the entire phase comparator, it is possible to realize demodulation with low electrical power consumption and simple circuit construction.

5 Claims, 6 Drawing Sheets

CIRCUIT FOR DEMODULATING PSK MODULATION SIGNALS

BACKGROUND OF THE INVENTION

1. Field of the Invention

This invention relates to a circuit for demodulating PSK modulated signals, and particularly to a demodulator including a differential-detection circuit for performing differential-detection of PSK modulated signals, and more particularly to an improved means for converting modulated frequency signals into phase data.

2. Description of the Related Art

Phase shift keying (hereinafter called PSK) is currently known as one method of digital modulation; it is possible to obtain a modulated signal suitable for data transfer by switching the phase of a carrier wave to multiple phases (e.g., four phases).

To demodulate such a PSK modulated signal, a demodulation method is also currently known in which the PSK modulated signal is converted in frequency into a quasi-base band and then differential-detection of the resulting signal is performed.

This quasi-base band frequency conversion is advantageous in that it is unnecessary to exactly coincide the carrier frequency of a modulated signal with the locally oscillated frequency of the demodulator, enabling accurate base band demodulation by correcting this frequency difference by a frequency error compensator circuit.

In another differential-detection method, differential detection is performed between two successive symbols (minimal unit of transfer data) to obtain a difference between symbol data during demodulating so that detection can be made with the preceding phase as a reference phase. This differential-detection method has hitherto widely been used as a differentially encoded phase shift keying (DPSK) which transfers the change of a digital signal.

However, in these conventional demodulation methods, the modulated signal is processed as a digital complex signal, thus making the construction of the demodulator circuit complicated. More particularly, the circuit for detecting phase data from the modulated signal would be made complicate.

Figure 6:
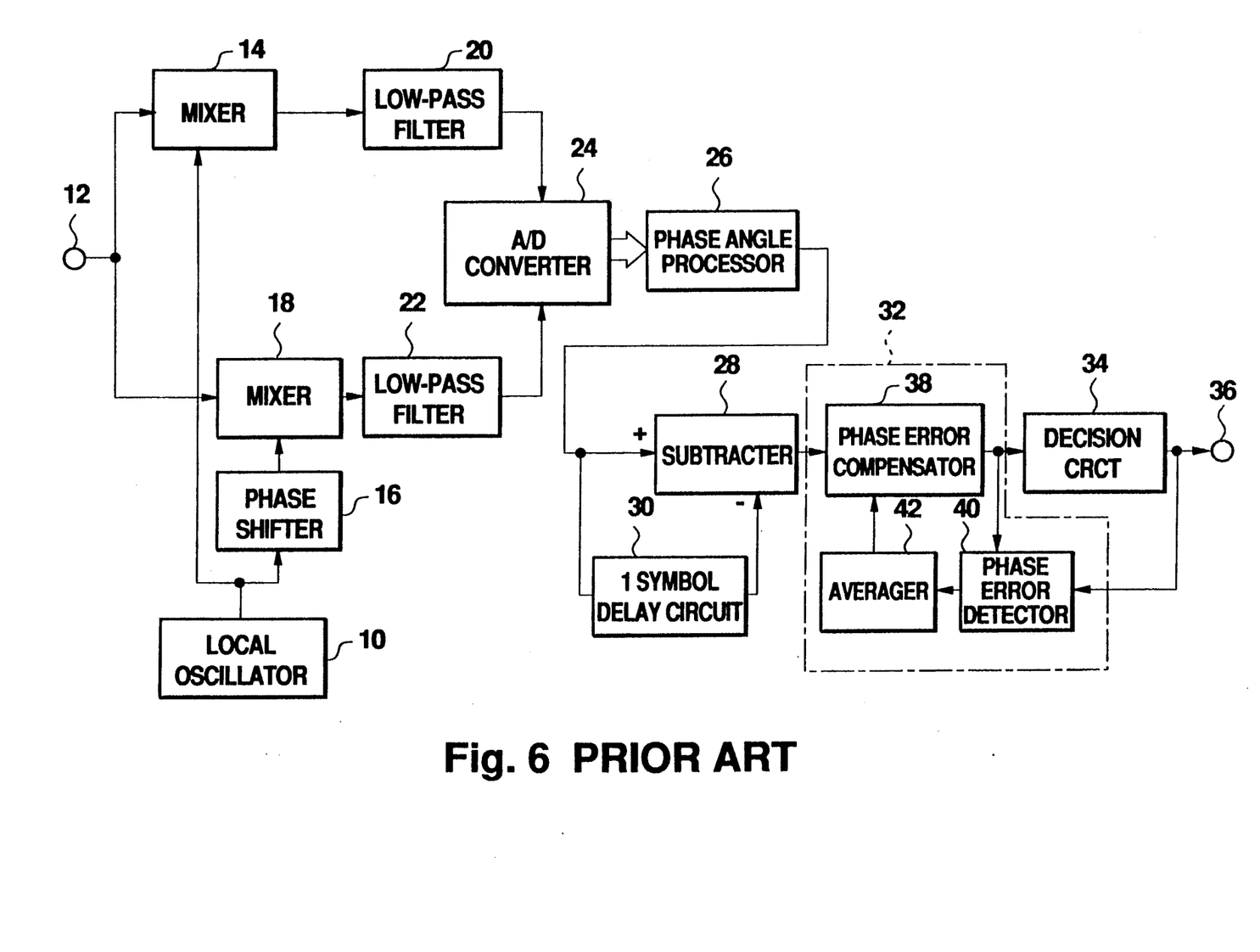
FIG. 6 is a block diagram showing a typical conventional differential-detection circuit.

FIG. 6 of the accompanying drawings shows a typical conventional demodulator circuit which includes a differential-detection circuit for PSK modulated signals.

As shown in FIG. 6, this demodulator circuit comprises a local oscillator 10 for oscillating a predetermined frequency, a mixer 14 for receiving a PSK modulated signal from an input terminal 12 and mixing the PSK modulated signal with a locally oscillated signal outputted from the local oscillator 10, a phase shifter 16 for shifting a locally oscillated signal by $\pi/2$, and a mixer 18 for receiving a PSK modulated signal from the input terminal 12 and mixing the PSK modulated signal with the output of the phase shifter 16. Thus the PSK modulated signals to be received by the mixers 14, 18 from the input terminal 12 are converted into quasi-base band signals by locally oscillated signals respectively outputted from the local oscillator 10 or by the locally oscillated signals shifted in phase by $\pi/2$.

The mixers 14, 18 are connected to low-pass filters 20, 22, respectively, so that harmonic components of the quasi-base band signals outputted from the mixers 14, 18 are cut off by the low-pass filters 20, 22.

Both the low-pass filters 20, 22 are connected to an A/D converter 24 where quasi-base band signals supplied via the low-pass filters 20, 22 are converted into complex amplitude data.

The A/D converter 24 is connected to a phase angle processor 26, which converts complex amplitude data into phase data and outputs the phase data.

The phase angle processor 26 is connected at one end directly to a substracter 28 and at the other end to the same substracter 28 via a 1-symbol delay circuit 30.

The 1-symbol delay circuit 30 delays phase data by 1 symbol duration. The subtractor 28 receives phase data from the phase angle processor 26 and also phase data delayed by 1-symbol delay circuit 30, subtracts the latter phase data from the from phase data, and outputs the result of subtraction as a phase difference signal.

The subtracter 28 is connected to a frequency error compensator 32 which compensates a frequency error of phase difference signal created due to the difference between transmitting carrier frequency and locally oscillated signal. The frequency error compensator 32 is connected to a decision circuit 34.

The decision circuit 34 decides 1, 0 data based on the phase difference signal whose frequency error has been compensated by the frequency error compensator 32. Therefore the demodulated signal derived from the supplied data is outputted from the decision circuit 34 to an output terminal 36.

Further, the output of the decision circuit 34 is used in compensating the frequency error in the frequency error compensator 32. The frequency error compensator 32 includes a phase error compensator circuit 38 connected to the output of the subtracter 28 for compensating a frequency error of phase difference signal, a phase error detector circuit 40 for detecting a frequency error based on both the output of the phase error compensator circuit 38 and the output of the decision circuit 34, and a averager 42 for averaging the output of the phase error detector circuit 40 and supplying an amount of compensation to the phase error compensator circuit 38.

The phase error compensator circuit 38 is an adder for adding the compensation amount, outputted from the averager 42, with the phase difference signal, outputted from the subtracter 28. When the amount of compensation is scarce or excessive in the compensator circuit 38, this lacking or excessive amount will be detected in the phase error detector circuit 40. The phase error detector circuit 40 outputs phase data for making the compensation proper, and the averager 42 averages the output of the phase error detector circuit 40 to smooth the phase data change resulting from noise and supplies the amount of compensation to the phase error compensator circuit 38.

Thus in the conventional differential-detection, modulated signals are converted into quasi-base band signals and further into complex amplitude data, whereupon the resulting data is converted into phase data.

However, the conventional demodulation methods have the following problems because the circuit for converting modulated signals into phase data is an analog circuit.

Analog elements must be used to compose the mixers and the low-pass filters so that it is difficult to integrate these components on a single semiconductor chip and hence to make them free from adjustment.

Generally, an analog-to-digital converter has been used as a digital complex signal converter; however, since the consumed electrical power of this analog-to-digital converter is large, it is difficult to save the consumed electrical power.

Further, a memory having a large storage capacitance is required to compose the phase angle processor.

SUMMARY OF THE INVENTION

It is therefore an object of this invention to provide a low-power-consumption differential-detection circuit, which does not require a large-storage-capacity memory, without using analog means in converting modulated signals into phase data.

According to a first aspect of the invention, there is provided a demodulator circuit for demodulating a PSK modulated signal, comprising: a local oscillator for outputting a locally oscillated signal having a PSK modulated carrier frequency; a digital phase detector for receiving both a modulated signal and the locally oscillated signal and comparing the two signals and outputting a phase difference between the two signals; a 1-symbol delay circuit for delaying, by a time of 1 symbol, phase data outputted from the digital phase detector circuit; a subtracter for receiving each phase data outputted from the digital phase detector and the 1-symbol delay circuit and obtaining an change of the phase data during the time of 1-symbol and outputting the phase data change as a phase difference signal; and a decision circuit for making a decision of each symbol based on the phase difference signal outputted from the subtracter.

Further, the present invention comprises a local oscillator for outputting a locally oscillated signal having a PSK modulated carrier frequency; a digital phase detector circuit for receiving both a modulated signal and the locally oscillated signal and comparing the two signals and outputting a phase difference between the two signals; a 1-symbol delay circuit for delaying, by a time of 1 symbol, phase data outputted from said phase detector circuit; a subtracter for receiving each phase data outputted from said phase detector circuit and said 1-symbol delay circuit and obtaining an change of the phase data during the time of 1-symbol and outputting the phase data change as a phase difference signal and a decision circuit for making a decision of each symbol based on the phase difference signal outputted from the subtracter.

Preferably, the phase detector includes: a flip-flop adapted to be set by the modulated signal and to be reset by the locally oscillated signal; a counter for counting predetermined clock signals in an output width of the flip-flop; and a latch circuit for latching the output of the counter as a phase difference between the modulated signal and the locally oscillated signal.

With this differential-detection circuit, a phase difference between the modulated signal and the locally oscillated signal is obtained, and then differential detection is performed using this phase difference. In the differential-detection circuit, a plurality of reference signals of different phases are produced from the locally oscillated signal by a shift register.

When the modulated signal is received by the phase data converting means, this modulated signal is compared respectively with the plural reference signals by a plurality of phase comparators. The phase comparator outputs 2-value signals, which indicate coincidence or dissidence of the modulated signal and reference signals, to the phase data decision circuit.

The phase data decision circuit decides, based on the 2-value signals supplied from the phase comparators, a range in which the phase of the modulated signal exists. As described above, the plural reference signals have different phases. Therefore, the 2-value signal to be outputted from each phase comparator has a value indicating whether or not each reference signal coincides with the modulated signal, namely, whether the modulated signal is larger or smaller in phase than each reference signal. If one of the 2-value signal associated with a phase comparator indicates coincidence and the other indicates dissidence, a decision can be made such that the phase of the modulated signal is larger than the former and smaller than the latter.

The phase data decision circuit decides, based on such 2-value signal, a range in which the phase of the modulated signal exists, and outputs as phase data a value representing this range.

Therefore, in this invention, conversion from modulated signals into phase data can be performed without using any analog means or any analog-to-digital converter or any large-capacitance memory.

Further, in this invention, the phase difference can be measured by counting clocks from both the modulated signal and the locally oscillated signal by a counter.

DETAILED DESCRIPTION

Preferred embodiments of this invention will now be described with reference to the accompanying drawings.

Like reference numerals designate parts or elements similar to those of the conventional art, any repetition of description being omitted here for clarity.

Figure 1:
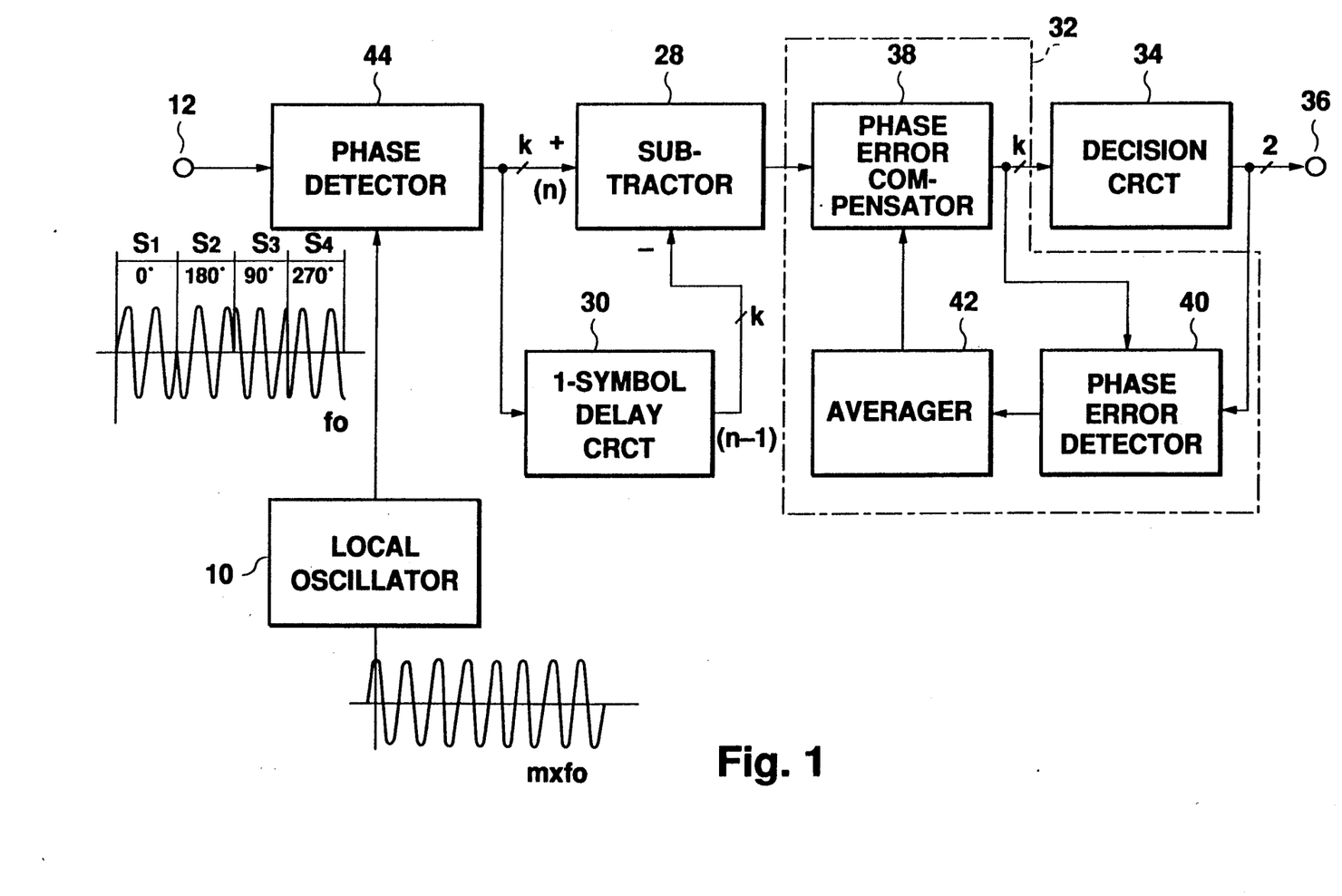
FIG. 1 is a block diagram showing a differential-detection circuit according to one embodiment of this invention.

FIG. 1 shows a differential-detection demodulator circuit which is a quadru-phase PSK differential-detection circuit.

In this illustrated embodiment, the mixers 14, 18, the phase shifter 16, the low-pass filters 20, 22, the A/D converter 24 and the phase angle processor 26 of the conventional art are replaced by a phase detector 44 where a quadru-phase PSK modulated signal received from the input terminal 12 is converted into k-bit phase data (k is an integer).

Figure 2:
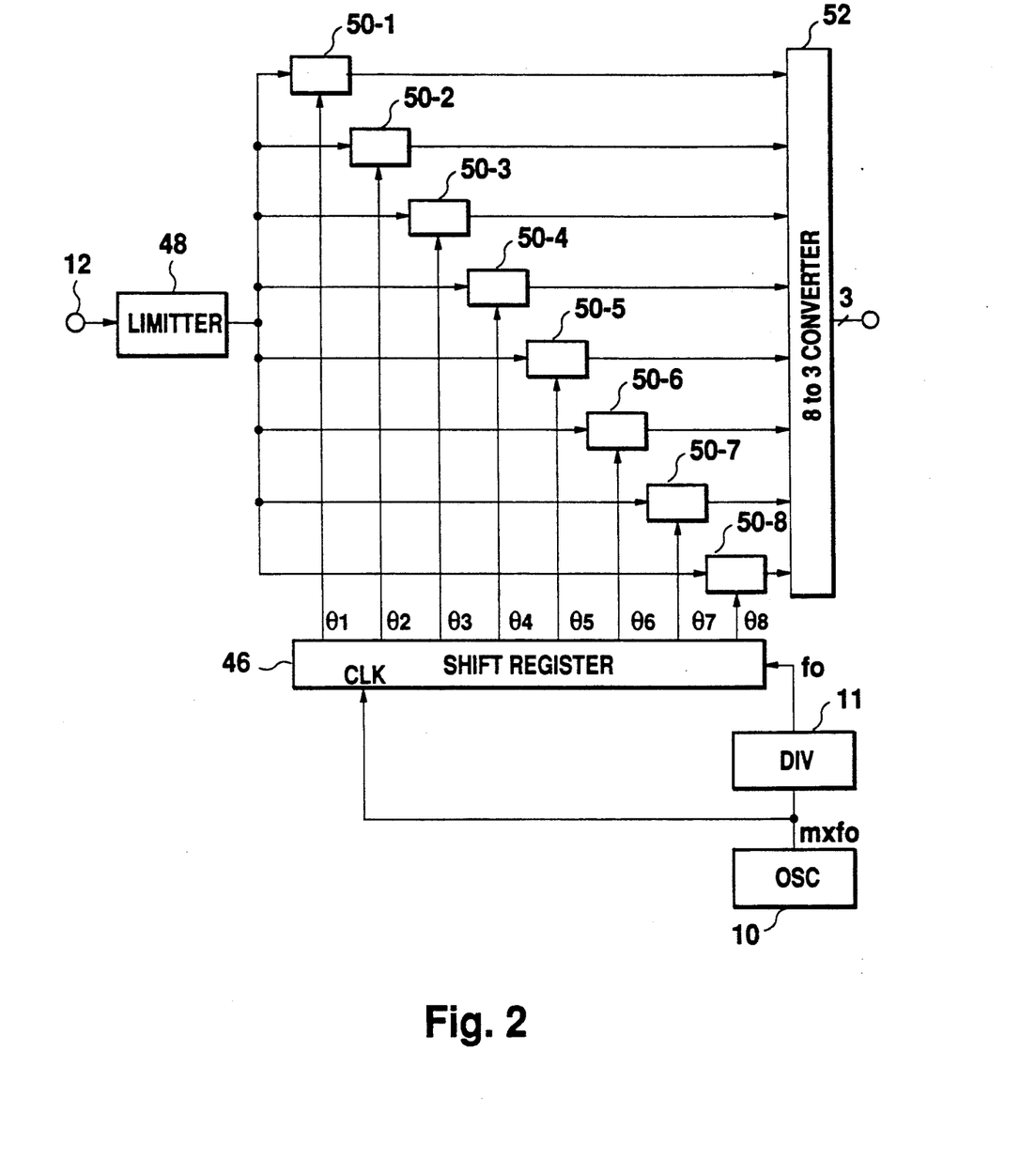
FIG. 2 is a block diagram showing a preferred phase detector according to a first embodiment of this invention.

FIG. 2 shows the construction of the phase detector 44.

The phase detector 44 includes a shift register 46 for receiving signals from a local oscillator 10. The local oscillator 10 has an oscillated frequency m times a carrier frequency $f_o$, e.g. $8 \times f_o$. This high-frequency signal is supplied to the clock input of the shift register 46, and a signal whose frequency is divided into eight conponments by a frequency divider 11; namely, the ratio of frequency division is ⅛. As a result, from the frequency divider 11, a signal whose signal is substantially equal to the carrier frequency $f_o$ is supplied to the shift input of the shift register 46.

Meanwhile, a quadru-phase PSK modulated signal received from the input terminal 12 is limited to a predetermined voltage level by a limiter 48 and is supplied as a digital signal to a subsequent comparator.

The phase detector 44 includes eight digital comparators 50-1 through 50-8; the modulated signal outputted from the limiter 48 is supplied to all of the comparators 50, while data of different phase of the shift register 46, i.e. $\theta 1-\theta 8$, is supplied to all of the comparators 50. Each comparator compares the inputted modulated signal in phase with a reference signal and outputs the result of comparison.

These results of comparison are supplied to an 8 to 3 converter 52 which outputs this phase as a 3-bit signal based on the inputted eight signals.

The operation of this embodiment will now be described.

Figure 3:
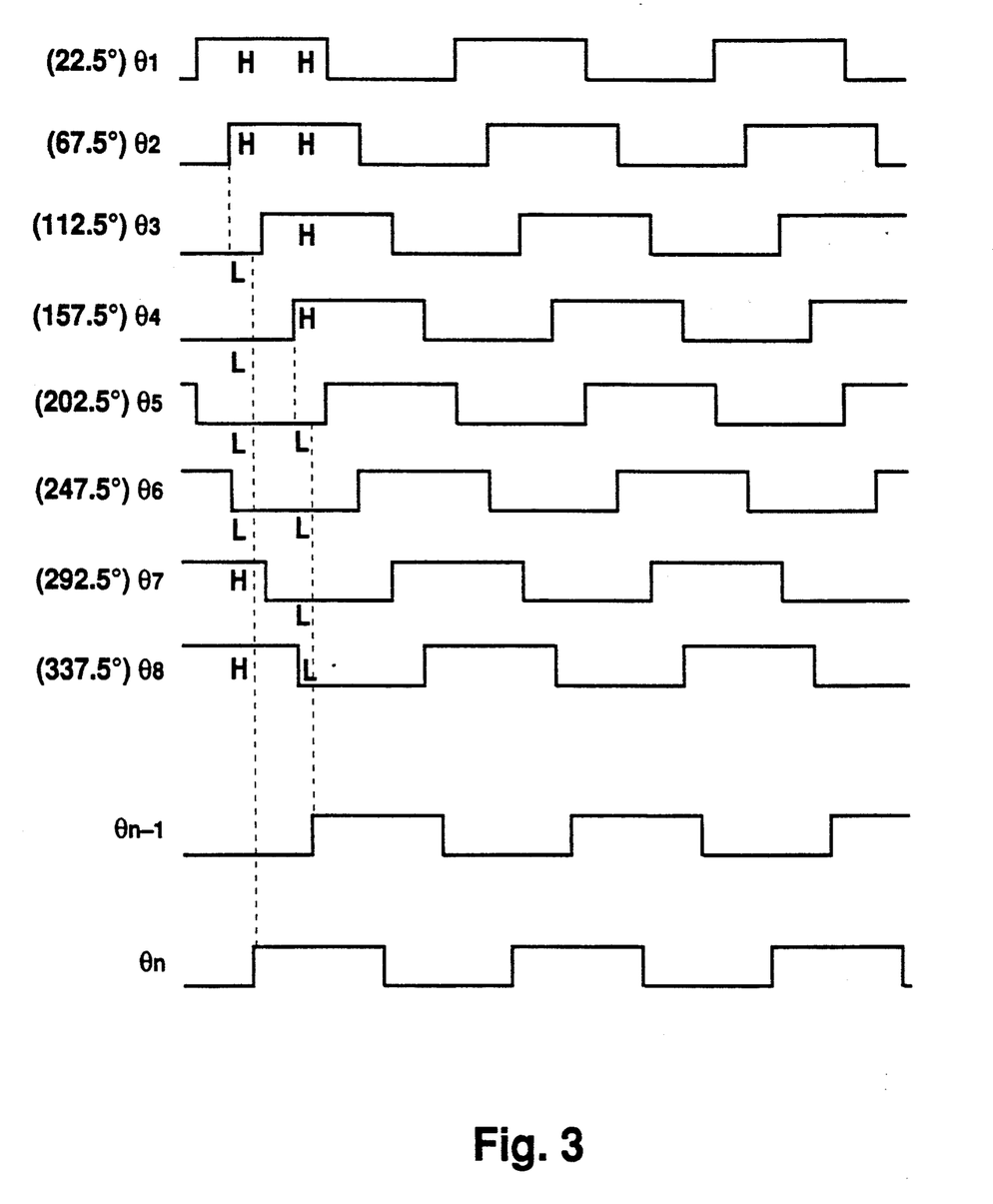
FIG. 3 is a timing chart showing the operation of the first embodiment.

FIG. 3 is a timing chart showing the operation of the phase detector 44. Reference signals $\theta 1-\theta 8$ are different from one another by 45°. For example, the reference signal $\theta 1$ has a phase of 22.5°; the reference signal $\theta 2$, a phase of 67.5°; . . . ; and the reference signal $\theta 8$, a phase of 337.5°.

In symbol $n-1$, assuming that a modulated signal $\theta_{n-1}$ is inputted, the phase comparators 50-1, 50-2, . . . , 50-8 compare the respective reference signals $\theta 1, \theta 2, . . . , \theta 8$ with the modulated signal $\theta_{n-1}$. If the result of comparison shows coincidence, the phase comparators 50-1, 50-2, . . . , 50-8 output a signal of H value. If the result of comparison shows dissidence, they output a signal of L value.

Assuming that the modulated signal $\theta_{n-1}$ has a phase of 170°, for example, the output of the phase comparator 50-1 will be an H value. Likewise, the output of each of the phase comparators 50-2, 50-3, 50-4 will be an H value. However, since the phase of the reference signal $\theta 5$ supplied to the phase comparator 50-5 is 202.5°, the output of the phase comparator 50-5 will be an L value. As a result, signals to be supplied to the 8 to 3 converter 52 will be HHHHLLLL in the order of phase comparators.

In the 8 to 3 converter 52, a range in which the phase of the modulated signal $\theta_{n-1}$ exists is decided based on the signals supplied from the phase comparators 50-1, 50-2, . . . , 50-8. In this case, partly since the signal supplied from the phase comparator 50-4 is an H value and partly since the signal supplied from the phase comparator 50-5 is an L value, it is decided that the phase of the modulated signal $\theta_{n-1}$ exists within a range of 157.5° to 202.5°. The 8 to 3 converter 52 outputs, as phase data, a value representing a range of 157.5° to 202.5°, e.g. 180°.

Similarly, assuming that in symbol n the modulated signal $\theta_n$ is supplied, if the modulated signal $\theta_n$ has a phase of 265°, the outputs of the phase comparators 50-1, 50-2, . . . , 50-8 will be HHLLLLHH in order. The 8 to 3 converter 52 decides similarly to the case of timing $n-1$ and outputs, as phase data, a value 270° representing a range of 247.5$\theta$ to 292.5$\theta$.

Likewise in the conventional art, the thus obtained phase data is supplied to both the subtracter 28 and the 1-symbol delay circuit 30. In the subtracter 28, the phase data relating to the modulated signal $\theta_{n-1}$ (180°) is subtracted from the phase data relating to the modulated signal $\theta_n$ so that the phase difference signal to be outputted from the subtracter 28 will be a phase difference signal indicating 90°.

When the phase difference signal having such value is supplied to a decision circuit 34 via a frequency error compensator 32, the decision circuit 34 makes a decision of symbol. In this embodiment, since the predetermined relationship between the angle between two symbols and demodulation data is 0°(0,0), 90°(1, 0), 180°(1, 1) and 270°(0, 1), a symbol of (I, Q)=(1, 0) is decided.

In this embodiment, it is possible to convert the modulated signal into phase data using only a digital means, without any analog means. In the absence of analog elements or parts, it is easy to integrate parts on a single semiconductor chip and also to make them free from adjustment.

In addition, since this demodulator circuit unlike the conventional demodulator circuit 24 is constructed without using an analog-to-digital converter or a phase angle converter 26, which requires a large-capacitance memory, it is possible to reduce the consumed electrical power of the circuit and also to simplify the construction of the circuit.

In this embodiment, the eight-phase reference signals $\theta 1-\theta 8$ and quadru-phase PSK are used. Alternatively, a different modulation method may or a different number of phases of reference signal may be used. Namely, this invention can be applied to a modulation method, besides PSK, which is differentially detectable. Further, it is possible to improve the accuracy of phase data by increasing the number of phases of reference signal.

Figure 4:
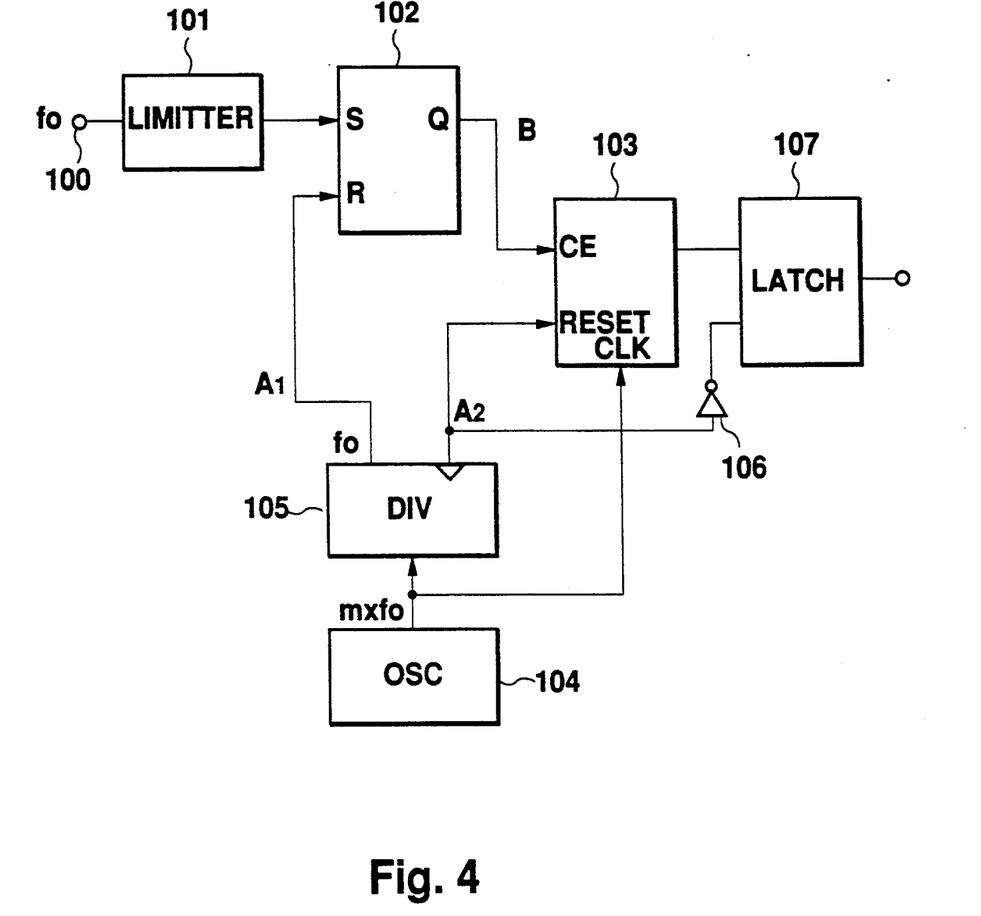
FIG. 4 is a preferred phase detector according to a second embodiment.

FIG. 4 shows a preferred phase detector according to a second embodiment. This phase detector, like the first embodiment, is a digital circuit.

A quadru-phase PSK modulated signal supplied from an input terminal 100 and having a carrier frequency $f_o$ is limited to a predetermined voltage level by a limiter 101, and the resulting signal is supplied to the set input of a flip-flop (FF) 102 as a digital signal.

Figure 5:
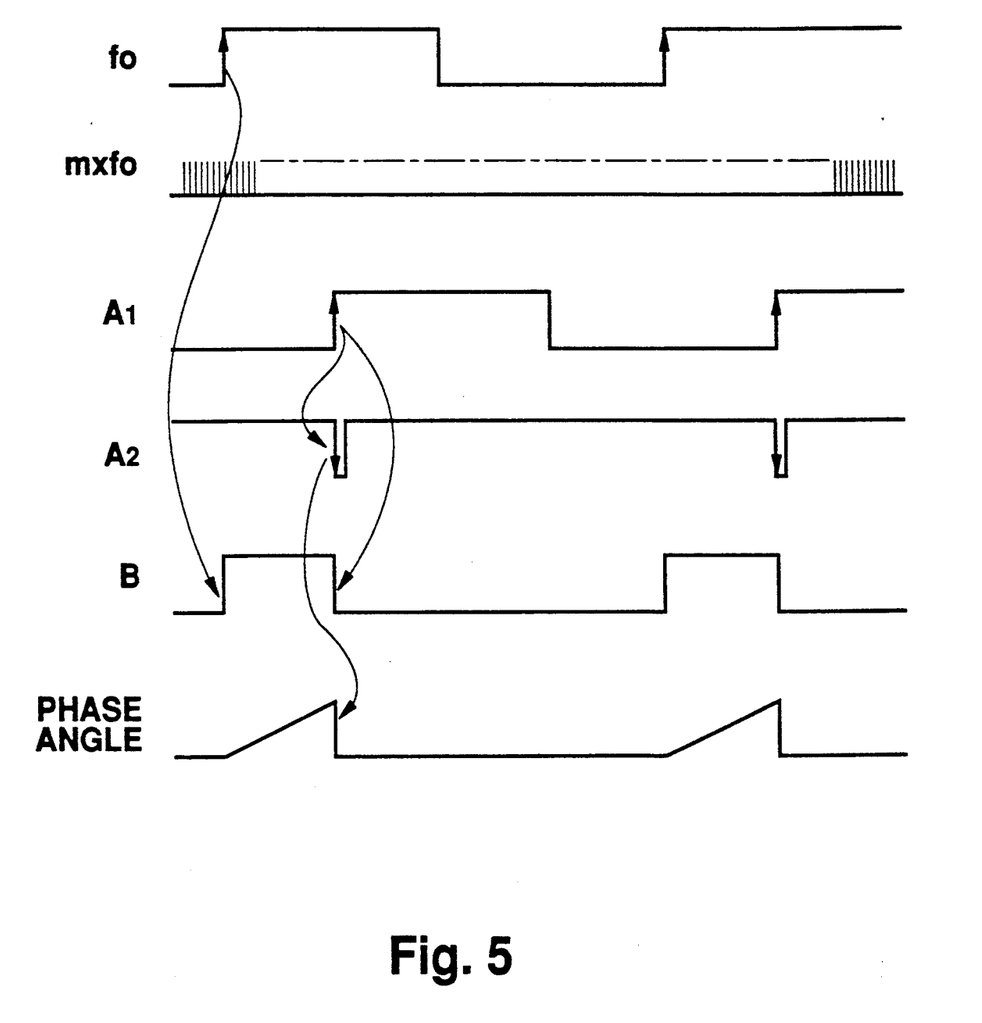
FIG. 5 is a timing chart showing the operation of the second embodiment.

FIG. 5 is a timing chart showing the operation of the second embodiment, in which FF 102 is set by the rising of the inputted modulated signal.

In the second embodiment, the phase difference between the inputted modulated signal and a locally oscillated signal is counted by a counter 103. To the clock input of the counter 103, count clocks m times the carrier frequency are supplied from a clock signal oscillator 104. To the count enable terminal (CE) of the counter 103, Q signal B of FF 102 is supplied, and to the reset input of the counter 103 the output A2 of a frequency divider 105 is supplied.

As a result, in FIG. 4, a carrier frequency signal of the demodulator circuit is obtained by the oscillator 104 and the divider 105 and is supplied to the reset terminal of FF 102 as a signal A1. The output B of FF 102, as shown in FIG. 5, has a pulse width from the rising of the inputted modulated signal to the rising of the locally oscillated signal in the demodulator circuit. Then the counter 103 counts clocks (m×$f_o$) between the outputs B.

From the divider 105, a pulse signal A2 is outputted at the same timing as the locally oscillated signal A1. The pulse signal A2 is then supplied to the latch input of a latch circuit 107 via an inverter 106. The latch circuit 107 latches a count value of the counter 103, whereupon the counter 103 is reset by the pulse signal A2 to become prepared for the next phase difference operation.

Therefore, also in the second embodiment, the output of the latch circuit 107 indicates the phase difference between the inputted modulated signal and the locally oscillated signal of the demodulator circuit, and this output will be used in differential-detection as described above.

The phase comparator circuit, like the first embodiment, is composed of only digital circuits and hence can be simplified.

According to this invention, since the means for converting the modulated signal is realized by a digital means based on 2-value signals, no analog element is required so that it is easy to integrate all elements or parts of the circuit on a single chip and to make the circuit free from adjustment. Further, since no analog-to-digital converter is required, it is possible to realize a low electrical power consumption. Since no large-capacitance memory is required, it is possible to simplified the circuit construction.

What is claimed is:

1. A demodulator circuit for demodulating a PSK modulated signal, comprising:
   (a) a local oscillator means for outputting a locally oscillated signal having a frequency equal to a PSK modulated carrier frequency;
   (b) a digital phase detector circuit for receiving both the modulated signal and the locally oscillated signal and comparing the two signals and outputting a phase data representative of a phase difference between the two signals;
   (c) a 1-symbol delay circuit for delaying, by a time of 1 symbol, the phase data outputted from said phase detector circuit;
   (d) a subtractor for receiving each phase data outputted from said phase detector circuit and said 1-symbol delay circuit and obtaining a change of the phase data during the time of 1-symbol and outputting the phase data as a phase difference signal; and
   (e) a decision means for making a decision on a value of demodulation data based on the phase difference signal outputted from the subtractor.

2. A demodulator circuit according to claim 1, wherein said phase detector circuit includes:
   (i) a shift register for shifting the locally oscillated signals in order to produce a plurality of reference signals of different phases;
   (ii) a plurality of phase comparators each for comparing the individual modulated signal with the respective reference signal and outputting a 2-value signal indicating whether the result of comparison is coincidence or dissidence; and
   (iii) a phase data decision circuit for deciding, based on the 2-value signals outputted from said phase comparators a range in which the phase of the modulated signal exists and outputting as phase data a value representing the range.

3. A demodulator circuit according to claim 1, wherein said phase detector circuit includes:
   (i) a flip-flop adapted to be set by the modulated signal and to be reset by the locally oscillated signal;
   (ii) a counter for counting predetermined clock signals in an output width of said flip-flop; and
   (iii) a latch circuit for latching the output of said counter as a phase difference between the modulated signal and the locally oscillated signal.

4. The demodulator circuit of claim 1, wherein said local oscillator means comprises:
   a local oscillator for outputting a signal having a frequency equal to m times said modulated signal, wherein m is an integer greater than 1;
   a divider for dividing the signal outputted from said local oscillator into signals having a frequency equal to the modulated signal and for outputting the divided signal as the locally oscillated signal.

5. The demodulator circuit of claim 1, wherein said decision means comprises:
   a frequency error compensator for compensating frequency errors of the phase difference signal outputted from the subtractor to output a compared phase difference signal; and
   a decision circuit for making said decision based on the compensated phase difference signal, wherein frequency errors of said phase difference signal are compensated by said frequency error compensator.

* * * * *